(12) United States Patent
Weber

(10) Patent No.: US 6,189,134 B1
(45) Date of Patent: *Feb. 13, 2001

(54) SYSTEM AND METHOD FOR SCOPING GLOBAL NETS IN A FLAT NETLIST

(75) Inventor: Larren Gene Weber, Calwell, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 09/255,244

(22) Filed: Feb. 22, 1999

Related U.S. Application Data

(63) Continuation of application No. 08/692,758, filed on Aug. 6, 1996, now Pat. No. 5,875,115.

(51) Int. Cl.[7] .................................................. G06F 17/50
(52) U.S. Cl. .......................... 716/18; 716/3; 716/7; 716/8; 716/12
(58) Field of Search ..................... 364/488–491, 364/578; 395/500.02–500.19; 716/1–21

(56) References Cited

U.S. PATENT DOCUMENTS

| | | | |
|---|---|---|---|
| 4,831,543 | * 5/1989 | Mastellone | 716/2 |
| 4,878,179 | * 10/1989 | Larsen et al. | 716/4 |
| 5,222,030 | 6/1993 | Dangelo et al. | 716/10 |
| 5,249,133 | 9/1993 | Batra et al. | 716/5 |
| 5,278,769 | 1/1994 | Bair et al. | 703/19 |
| 5,301,318 | 4/1994 | Mittal | 717/1 |
| 5,463,563 | 10/1995 | Bair et al. | 716/11 |
| 5,471,398 | 11/1995 | Stephens | 716/21 |
| 5,473,546 | * 12/1995 | Filseth | 716/8 |
| 5,481,473 | * 1/1996 | Kim et al. | 716/5 |

(List continued on next page.)

OTHER PUBLICATIONS

Frezza, S. T. et al. ("SPAR: a schematic place and route system", IEEE Transactions on Computer–Aided Design of Integrated Circuits and Systems, vol. 12, No. 7, Jul. 1993, pp. 956–973).*

Sekine, M. et al. ("An advanced design system: design capture, functional test generation, mixed level simulation and logic synthesis (VLSI)", IEEE Proceedings of IEEE 1989 Custom Integrated Circuits Conference, May 15, 1989, pp. 19.4/1–6).*

Frezza, S.T., et al., "SPAR: A Schematic Place and Route System", *IEEE Transactions on Computer–Aided Design of Integrated Circuits and Systems*, 12(7), 956–973 (Jul. 1993).

Sekine, M., et al., "An Advanced Design System: Design Capture, Functional Test Generation, Mixed Level Simulation and Logic Synthesis", *IEEE Proceedings of IEEE Custom Integrated Circuits Conference*, 19.4.1–19.4.6, (1989).

*Primary Examiner*—Paul R. Lintz
*Assistant Examiner*—Phallaka Kik
(74) *Attorney, Agent, or Firm*—Schwegman, Lundberg, Woessner & Kluth, P.A.

(57) ABSTRACT

A method and device for scoping global nets from a schematic in a flat netlist. The device is a complementary subsystem to a flat netlister software package. The device allows instances in a schematic to systematically reassign global nets to local nets so that the use of such nets does not affect usage of the global nets elsewhere in the circuit. The device tracks all global nets and maps the corresponding scoped nets to their net identifiers. Then, as the netlister creates the flat netlist, the device replaces the global net's net identifier with the correct net identifier of the corresponding scoped net.

18 Claims, 14 Drawing Sheets

U.S. PATENT DOCUMENTS

| | | | |
|---|---|---|---|
| 5,526,277 | * | 6/1996 | Dangelo et al. ............ 716/3 |
| 5,548,524 | * | 8/1996 | Hernandez et al. ............ 716/12 |
| 5,550,714 | * | 8/1996 | Nishiyama ............ 716/11 |
| 5,586,319 | | 12/1996 | Bell ............ 717/1 |
| 5,867,395 | * | 2/1999 | Watkins et al. ............ 716/18 |
| 5,875,115 | * | 2/1999 | Weber ............ 716/13 |
| 5,901,064 | * | 5/1999 | Weber et al. ............ 716/12 |

\* cited by examiner

FIG. 3A-1

```
310→   line 1    * net 3 vpp!
       line 2    * net 2 vcc!
       line 3    * net 1 vbb!
       line 4    * net 0 gnd!
       line 5    * net 4 /out2
       line 6    * net 5 /out1
       line 7    * net 6 /in2
       line 8    * net 7 /in1
312→   line 9    * net 8 /mapvccb
314→   line 10   * net 9 /mapvcca
       line 11   * volt(0) = /V12
316→   line 12   v0 8 0 dc='3.0'
       line 13   * volt(1) = /V14
317→   line 14   v1 9 0 dc='5.0'
       line 15   * net 12 /I2/net6
       line 16   * cap(2) = /I2/C9
318→   line 17   c2 2 12 c='1e-12'
       line 18   * cap(3) = /I2/C3
       line 19   c3 12 0 c='2e-12'
       line 20   * nn(4) = /I2/GI1/MNA
       line 21   m4 4 12 0 1 N 11'1.0' w='10.0'
       line 22   * pp(5) = /I2/GI1/MPA
```

```
324→  line 23   m5 4 12 2 3 P l='1.0' w='20.0'
      line 24   * nn(6)  = /I2/GI0/MNA
      line 25   m6 12 6 0 1 N l='1.0' w='10.0'
      line 26   * pp(7)  = /I2/GI0/MPA
328→  line 27   m7 12 6 2 3 P l='1.0' w='20.0'
      line 28   * net 26 /I1/net6
      line 29   * cap(8) = /I1/C9
331→  line 30   c8 2 26 c='1e-12'
      line 31   * cap(9) = /I1/C3
      line 32   c9 26 0 e='2e-12'
      line 33   * nn(10) = /I1/GI1/MNA
      line 34   m10 5 26 0 1 N l='1.0' w='10.0'
      line 35   * pp(11) = /I1/GI1/MPA
337→  line 36   m11 5 26 2 3 P l='1.0' w='20.0'
      line 37   * nn(12) = /I1/GI0/MNA
      line 38   m12 26 7 0 1 N l='1.0' w='10.0'
      line 39   * pp(13) = /I1/GI0/MPA
341→  line 40   m13 26 7 2 3 P l='1.0' w='20.0'
```

Traditional Flat Netlist

```
line 1      * net 3 vpp!
line 2      * net 2 vcc!
line 3      * net 1 vbb!
line 4      * net 0 gnd!
line 5      * net 4 /out2
line 6      * net 5 /out1
line 7      * net 6 /in2
line 8      * net 7 /in1
line 9      * net 8 /mapvccb
line 10     * net 9 /mapvcca
line 11     * volt(0) = /V12
line 12     v0 8 0 dc='3.0'
line 13     * volt(1) = /V14
line 14     v1 9 0 dc='5.0'
line 15     * net 12 /I2/net6
line 16     * cap(2) = /I2/C9
line 17     c2 9 12 c='1e-12'
line 18     * cap(3) = /I2/C3
line 19     c3 12 0 c='2e-12'
line 20     * nn(4) = /I2/GI1/MNA
line 21     m4 4 12 0 1 N 11 '1.0' w='10.0'
line 22     * pp(5) = /I2/GI1/MPA
```

349→ (line 2)
350→ (line 9)
351→ (line 10)
353→ (line 12)
355→ (line 14)
358→ (line 17)

```
364→  line 23   m5 4 12 9 3 P l='1.0' w='20.0'
      line 24   * nn(6)    = /I2/GI0/MNA
      line 25   m6 12 6 0 1 N l='1.0' w='10.0'
      line 26   * pp(7)    = /I2/GI0/MPA
368→  line 27   m7 12 6 9 3 P l='1.0' w='20.0'
      line 28   * net 26 /I1/net6
      line 29   *cap(8)    = /I1/C9
371→  line 30   c8 8 26 c='1e-12'
      line 31   * cap(9)   = /I1/C3
      line 32   c9 26 0 e='2e-12'
      line 33   * nn(10)   = /I1/GI1/MNA
      line 34   m10 5 26 0 1 N l='1.0' w='10.0'
      line 35   * pp(11)   = /I1/GI1/MPA
377→  line 36   m11 5 26 8 3 P l='1.0' w='20.0'
      line 37   * nn(12)   = /I1/GI0/MNA
      line 38   m12 26 7 0 1 N l='1.0' w='10.0'
      line 39   * pp(13)   = /I1/GI0/MPA
381→  line 40   m13 26 7 8 3 P l='1.0' w='20.0'
```

Scoped Flat Netlist

FIG. 3B-2

```
procedure (msCreateMapList()
  ;; Create an associated list of nets to be mapped
  prog( (tmp node)
    if ( (mapNodes != car(mapList)) then
      mapList = nil
      nodeList = parseString(mapNodes "=, ")
      while(nodeList
        wasNode = car(nodeList)
        isNode = cadr(nodeList)
        nodeList = cddr(nodeList)
        if(!(tmp = fnlNetSdaNameExtName (wasNode))
          printf("\n ERR ** format: %s in \"%s\""
            on %s\n" wasNode mapNodes
            fnlCurrentIns)
        if(rindex(isNode "!") then
          mapList = cons(list(tmp
            fnlNetSdaNameExtName(isNode ))
            mapList)
```

FIG. 8A-1

```
      else
         printf("\n ERR ** net %s cannot be
            found in %s\n" isNode
            fnlCurrentInstSdaName)
      )
   )
   mapList = cons(mapNodes mapList)
   printf("mapList = ")
   println(mapList)
```

SKILL CODE FOR MSCREATEMAPLIST()

FIG. 8A-2

© 1996 Micron Technology, Inc.

```
procedure (msFixNet (@rest nodes)
;; Exchange old name for new name if net is key of
    assoc list
prog( (node s Idrv Idrv_out key)
    if( mapNodes = fnlSearchPropString("mapnodes")
                nil) then
        msCreateMapList ()
    else
        mapList = nil
    )
    foreach (node nodes
        s = fnlTermSdaNameExtName(node)
        if(key = assoc(s cdr(mapList)) ) then s =
                cadr(key))
        fnlPrint(s) fnlPrint(" ")
    )
)
)
```

FIG. 8B

SKILL CODE FOR MSFIXNET()

```
procedure (msNet()
  ;; Create variable to map net names to pin names.
  ;; This would be unnecessary ifyou had a handle to
     the map file.
  netName = fnlCurrentNetSdaName()
  if(index(netName "Map") then
     sprintf(tmp, "%s = %s", substring(rindex(netName
        "/") 2) fnlCurrentNetExtName)
     evalstring(tmp)
  )
  sprintf(tmp, "* net %s = %s\n", fnlCurrentNetExtName,
     netName)
  fnlPrint(tmp)
  t
)
```

SKILL CODE FOR MSNET()

FIG. 8C

© 1996 Micron Technology Inc.

SYSTEM AND METHOD FOR SCOPING GLOBAL NETS IN A FLAT NETLIST

This application is a continuation of U.S. Ser. No. 08/692,758, filed Aug. 6, 1996, which will issue on Feb. 23, 1999 as U.S. Pat. No. 5,875,115.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to integrated circuits and in particular to the design, testing, and verification of integrated circuits.

BACKGROUND

Today's integrated circuits (ICs) contain many circuit elements. Computer-aided design (CAD) and computer-aided engineering (CAE) tools are essential in producing these complicated integrated circuits. Circuit design can be represented by a schematic. Schematics consist of symbol instances connected by nets which demonstrate the functional design of the circuit. Symbol instances are pictorial icons that represent a complete functional block. Symbol instances can be primitive elements, such as transistors and resistors. Symbol instances can also be abstractions of combinations of primitive elements, such as NAND gates and NOR gates. Symbol instances can also be higher level groupings of these various elements.

To produce the complicated schematics of an integrated circuit, CAD software can be used. CAD software allows symbols to be saved in software libraries for use by all circuit designers within the entire IC. Portions of the IC can be easily replicated, deleted, and changed with the CAD software.

Another representation of a circuit design is the netlist. A netlist is a text file describing a circuit. The netlist lists all of the symbol instances and their connecting nets within a schematic. CAE software can be used to translate a schematic into a netlist. In a flat netlist, all of the higher levels of symbol instances are replaced by their primitive components. Thus, a schematic having multiple instances of NAND gates would result in a netlist having a collection of transistors.

A netlist is used as input to another CAE tool, the simulator. Simulators use netlists and input stimulus files to imitate the function of the circuit design without having to incorporate the design in hardware. Simulating a circuit by providing netlists and stimulus data is an efficient and cost effective method of testing a circuit.

However, the massive complexity of current circuits introduces problems in circuit design. A typical circuit may now contain several million individual instances. These instances are connected by several million nets. A change in design implementation may necessitate the same change to several thousand corresponding blocks of the circuit. A change in a net within one block may cause unknown effects on other circuit blocks. Integrated circuit manufacturing also introduces problems with circuit design. Because the manufacturing process of ICs involves so many steps on such small objects, there is a relatively high number of imperfect chips made. To salvage such chips, circuits such as DRAM (dynamic random access memory) chips are designed with a higher number of gates than are needed. For example, a 4 Meg DRAM might be designed as a 4.01 Meg DRAM so that up to one-one hundredths of the memory gates may be imperfect on any chip and the chip will still have 4 Meg of functioning memory. After production, the portions of the memory gates which suffer from imperfections must be disabled. This is accomplished by providing several corresponding nets in the circuit. For example, instead of a single power source net (commonly referred to as vcc!), multiple local vcc nets may be implemented. Then, power may be withdrawn from the local vcc nets in the affected chip areas.

These problems in the IC design raise several needs in the art. There is a need for global nets, such as vcc!, to be localized. Then such local nets can be individually managed on the manufactured chips. The implementation of these locals nets needs to be convenient and efficient for the circuit designers and the simulation software packages. There is also a need to allow block changes, deletes, and additions to have a minimal amount of affect on the overall design of the circuit. Designers of blocks of ICs should be able to utilize global nets without necessarily worrying about the affect to other blocks of the chip.

SUMMARY OF THE INVENTION

A scoped global net engine is a complementary subsystem to a flat netlister software package. The netlister software package takes a schematic of a circuit and translates the instance symbols and connecting nets into a textual netlist for use by a simulator. The scoped global net engine allows instances to reassign global nets to local nets during the netlisting processing so that the use of such nets does not affect usage of the global nets elsewhere in the circuit.

The global net engine tracks all global nets and maps the corresponding scoped nets to their net identifiers. Then, as the netlister software package creates the flat netlist text, the global net engine replaces the global net's net identifier with the net identifier for the correct scoped net.

BRIEF DESCRIPTION OF THE DRAWINGS

FIG. 3A is a netlist created by a flat netlister program corresponding to the schematic of FIG. 2 without the scoped global nets.

FIG. 3B is a netlist created by a flat netlister program and the present invention, the scoped global net engine, corresponding to the schematic of FIG. 2 including the scoped global nets.

FIGS. 8A, 8B and 8C are one embodiment of the user-provided functions used to implement the present invention.

DETAILED DESCRIPTION

In the following Detailed Description, reference is made to the accompanying drawings which form a part hereof and in which is shown by way of illustration specific embodiments in which the invention may be practiced. These embodiments are described in sufficient detail to enable those skilled in the art to practice and to use the invention, and it is to be understood that other embodiments may be utilized and that changes may be made without departing from the spirit and scope of the present invention. The following Detailed Description is, therefore, not to be taken in a limiting sense and the scope of the invention is defined by the appended claims. In the figures, elements having the same number perform essentially the same functions.

SCHEMATICS

Figure 1:
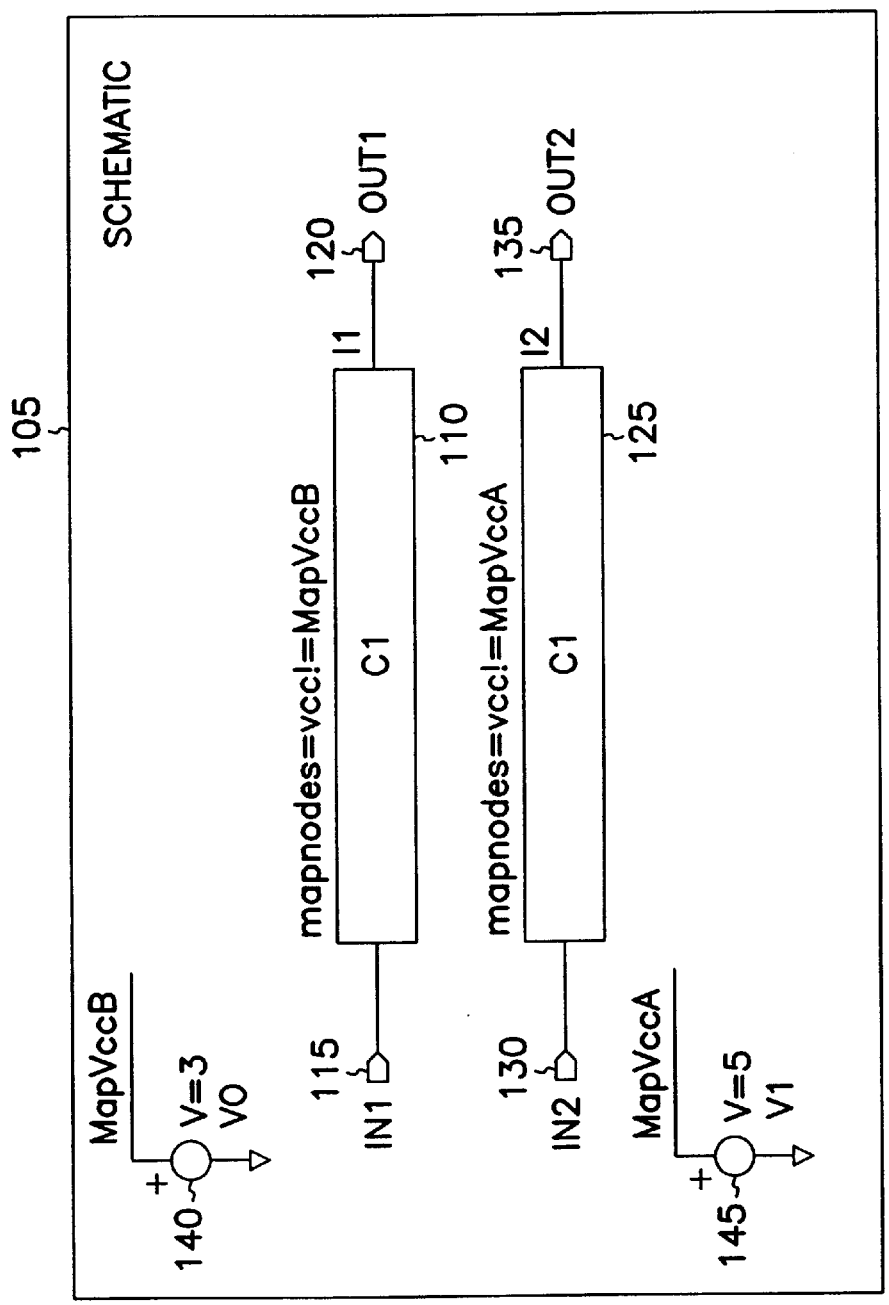
FIG. 1 is a schematic including two instances of block C1.

Circuits are often diagramed in schematics. In FIG. 1, two instances of block C1 110 and 125 are diagramed in a schematic 105. Such schematic 105 can be created by a computer-aided engineering (CAE) tool. One such CAE tool is Design Entry available from Cadence Design Systems, Inc., San Jose, Calif. Instance C1 110 includes nets IN1 115 and OUT1 120. Similarly, instance C1 125 includes nets IN2 130 and OUT2 135.

Instance 140 is a power supply that applies 3 volts to net MapVccB. Similarly, instance 145 applies 5 volts to net MapVccA. The voltages are often carried throughout the circuit by global nets. A global net is customarily denoted as vcc!, gnd!, etc. The "!" character in the net name indicates that the net is global to the entire schematic. However, circuit designers often need the ability to individually control global nets at various hierarchical blocks within the circuit. The present invention allows global nets to be scoped to a specific subcircuit. Scoping refers to limiting the affect of a net to a contained area.

With the present invention, such scoping of global nets is accomplished by the use of parameters. One form of parameter which can be used is a "property list". Property lists are data structures supported by Design Entry and other CAD software systems. A property list for an instance consists of a property name and a property value to be associated with the property name. For example, voltage could be a property which can be indicated on an instance. Power supply instance 140 has such a property list. Instance 140 has the requisite voltage shown by the property list having the property name of "v" and the property value of "3." Thus, for instance 140, schematic 105 indicates that three volts are applied. Likewise, power supply instance 145 contains a property list showing that five volts are applied.

Subcircuit instances 110 and 125 each have a property list as well. The property list of these instances has a property name of "mapnodes" and the property value of "vcc!= MapVccB" for instance 110 and "vcc!=MapVccA" for instance 125. The present invention achieves scoping of global nets through the creation of this mapnodes property list. "Node" is just another name for "net." Hence, the mapnodes property list name indicates that its function is to map nodes (or nets). This property list allows the circuit designer to map a global net to a local net. Therefore, the mapnodes property lists state that in instance 110, the global net vcc! is mapped to local net MapVccB, and in instance 125, the global net vcc! is mapped to local net MapVccA. Such mappings indicate that whenever the global net vcc! is referenced within instance C1 110 or instance C1 125, the local nets should be actually implemented instead. In one embodiment of the present invention, the local nets to which global nets are scoped must contain the string "Map" within their local net names in order for the scoping to be supported. This naming convention serves as a scope identifier, allowing the present invention to only track a portion of the local nets, i.e. the local nets having "Map" within their names. In other embodiments, the scope identifier could be changed to another string or eliminated allowing all nets to be accessible.

Figure 2:
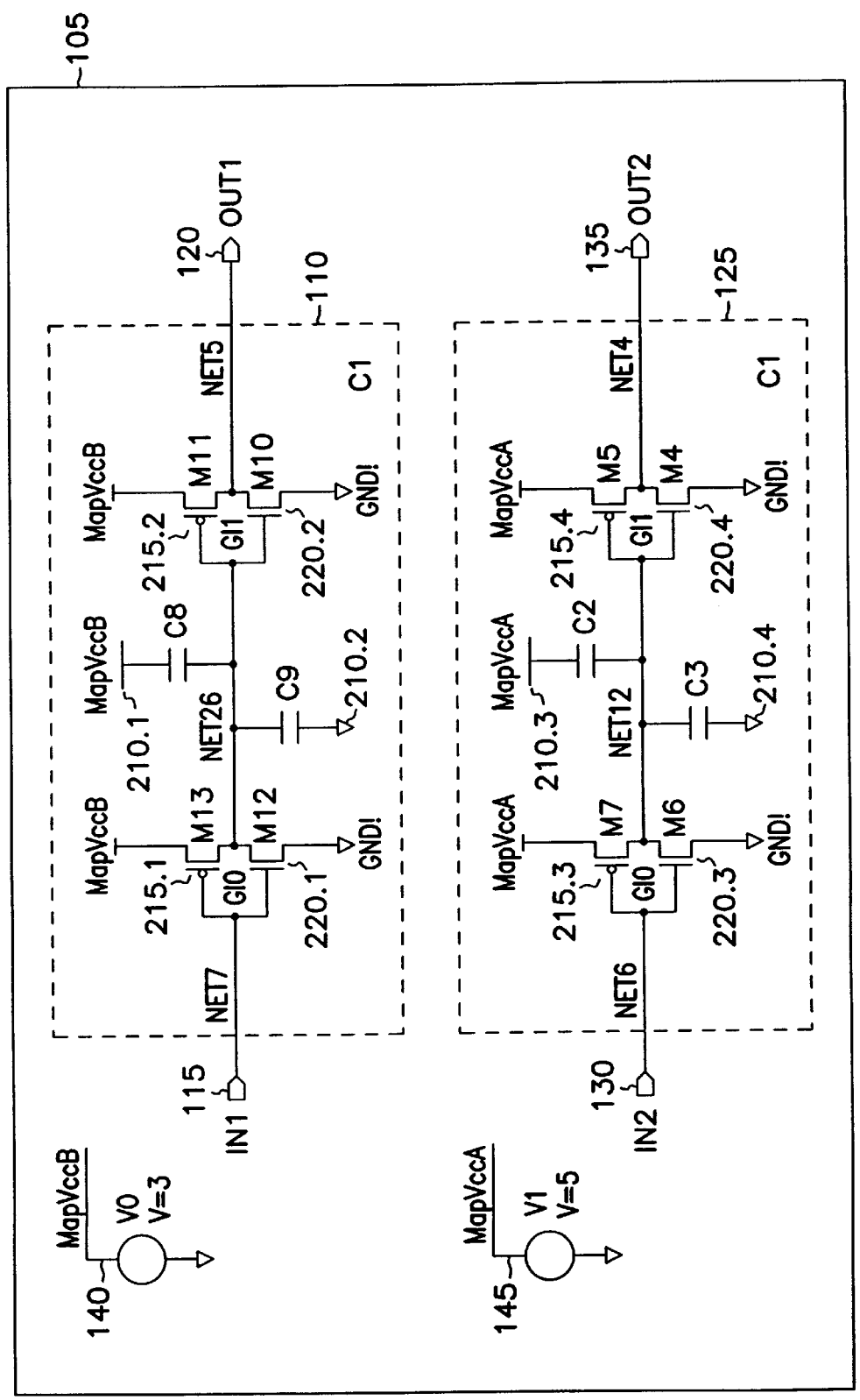
FIG. 2 is a flattened representation of the schematic from FIG. 1.

FIG. 2 is the flattened representation of schematic 105, where inverters are shown as their elementary pair of p-type 215 and n-type 220 transistors. FIG. 2 also shows capacitors C8 210.1, C9 210.2, C2 210.3 and C3 210.4, in-nets IN1 115 and IN2 130, out-nets OUT1 120 and OUT2 135, and power supplies 140 and 145. Power supply 140's net is mapped to MapVccB and power supply 145's net is mapped to MapVccA. Thus, FIG. 2 indicates that schematic 105 can either act in a traditional manner, using the global vcc! net, or schematic 105 can scope the global net vcc! to local net MapVccB for use with instance C1 110 and to local net MapVccA for use with instance C1 125. This scoping, again, is accomplished through the entry of the mapnodes property list parameter at the higher level of schematic 105, shown by FIG. 1.

To be useful to a simulator software package, schematic 105, must be translated into a textual netlist file. This translation is done by a translation program, called a netlister. There are two types of netlisters. A flat netlister creates a netlist showing the primitive elements of schematic 105 in a flattened, single level. A hierarchical netlister creates a hierarchical netlist. Such a hierarchical netlist includes definitions of higher level blocks of schematic 105. A hierarchical netlist program is described in the co-pending patent application titled "SCOPING GLOBAL NETS IN A HIERARCHICAL NETLIST," by Weber et al., U.S. patent application No. 08/692,742 filed on even date herewith, which is hereby incorporated by reference. U.S. patent application No. 08/692,742 describes the scoping of global nets for output to a hierarchical netlist. A hierarchical netlist only provides a single placement definition for each of the named blocks in a schematic. In a flat netlist, every placement of a block is incorporated into the netlist. A second functional difference between the two types of netlisters is that while a hierarchical netlister only inspects the current hierarchical level for net scoping effects, a flat netlister inspects the current hierarchical level and all higher hierarchical levels of the circuit design.

With respect to flat netlisting, in one embodiment, the netlister used to produce a flat netlist is FNL. The skeleton program of FNL is provided by Cadence Design Systems, Inc., San Jose, Calif. Other netlisters could be used. FNL from Cadence allows the easy integration of client-written subroutines to perform specific functionality. In one embodiment, the present invention, the global netlist engine, is implemented as a set of these interfaced subroutines to FNL.

FLAT NETLISTS

FIG. 3A shows a traditional flat netlist produced by FNL for schematic 105 using the global nets. The netlist is a textual coded description of all primitive elements in schematic 105 and how these elements are connected by nets. In schematic 105, nets can be referenced with string names or not referenced at all. The FNL, however, assigns each net a distinct net identifier. In FIG. 3A, the net identifier is always a number. In other netlists, the net identifier could readily be an alphanumeric string. In the following discussion, net identifiers shall be referred to as net numbers. Common nets from schematic 105 are given the same net number. In FIG. 3A, the global net vcc! is assigned net number 2 This fact is noted in the comment line at line 2 310. In this embodiment of a netlist, all comments begin with an asterisk (*). Line 17 318 describes capacitor 210.3 from schematic 105. Capacitor definitions are noted with the initial letter "c". Capacitor 210.3 is connected to vcc! (net 2) in line 17 318. Line 23 324 describes the p-type mosfet 215.4 which is within inverter 205.4. The "m" at the beginning of line 23 324 indicates the definition is for a mosfet device. The "P" within line 23 324 indicates that transistor 215.4 is a p-type rather than an n-type mosfet. Line 23 324 states that nets 4, 12, 2 and 3 are connected to p-type mosfet 215.4. Line 27 328 describes p-type mosfet 215.3. Line 27 328 states that nets 12, 6, 2 and 3 are connected to p-type mosfet 215.3.

In a flat netlist, all instantiations of a subcircuit are listed. For example, in the flat netlist of FIG. 3A, instance C1 110 and instance C1 125 are both fully described in the flat netlist. Similar to the earlier lines, line 30 331, line 36 337 and line 40 341 describe the elements of instance C1 110 with respect to vcc!. Capacitor 210.1 which is connected to nets 2 and 26 is defined in line 30 331. P-type mosfet 215.2 is detailed in line 36 337 as connected to nets 5, 26, 2 and 3. Line 40 341 describes p-type mosfet 215.1 as connected to nets 26, 7, 2 and 3.

FIG. 3B is similar to FIG. 3A's traditional flat netlist. FIG. 3B is the scoped flat netlist for schematic 105 including the scoped global nets MapVccA and MapVccB that are supported by the present invention. Line 9 350 and line 10 351 have been added by the present invention as comment lines to indicate that net 8 is reserved for local net MapVccB and net 9 is reserved for local net MapVccA. The power supply instance 140 is described by line 12 353 of scoped flat netlist. Line 12 353 states that 3.0 volts is applied to net 8. The power supply instance 145 is described by line 14 355, indicating 5.0 volts is applied to net 9.

Line 17 358 defines the capacitor for instance C1 125 as was done in line 17 318 of traditional flat netlist in FIG. 3A. Notice that instead of receiving power from vcc!, which is net 2, the capacitor receives power from net 9, which is the local net MapVccA to which vcc! has been scoped. Likewise, line 30 371 defines the capacitor for instance C1 110. Notice that this line shows the capacitor receiving power from net 8, which is the local net MapVccB.

Line 23 364 and line 27 368 describe the p-type mosfets 215.4 and 215.3. In these lines, vcc! (net number 2) has been replaced by the scoped global MapVccA (net number 9). Line 36 377 and line 40 381 describe p-type mosfets 215.2 and 215.1. Here, vcc! (net number 2) has been replaced by the scoped global MapVccB (net number 8).

SCOPED GLOBAL NET ENGINE

Figure 4:
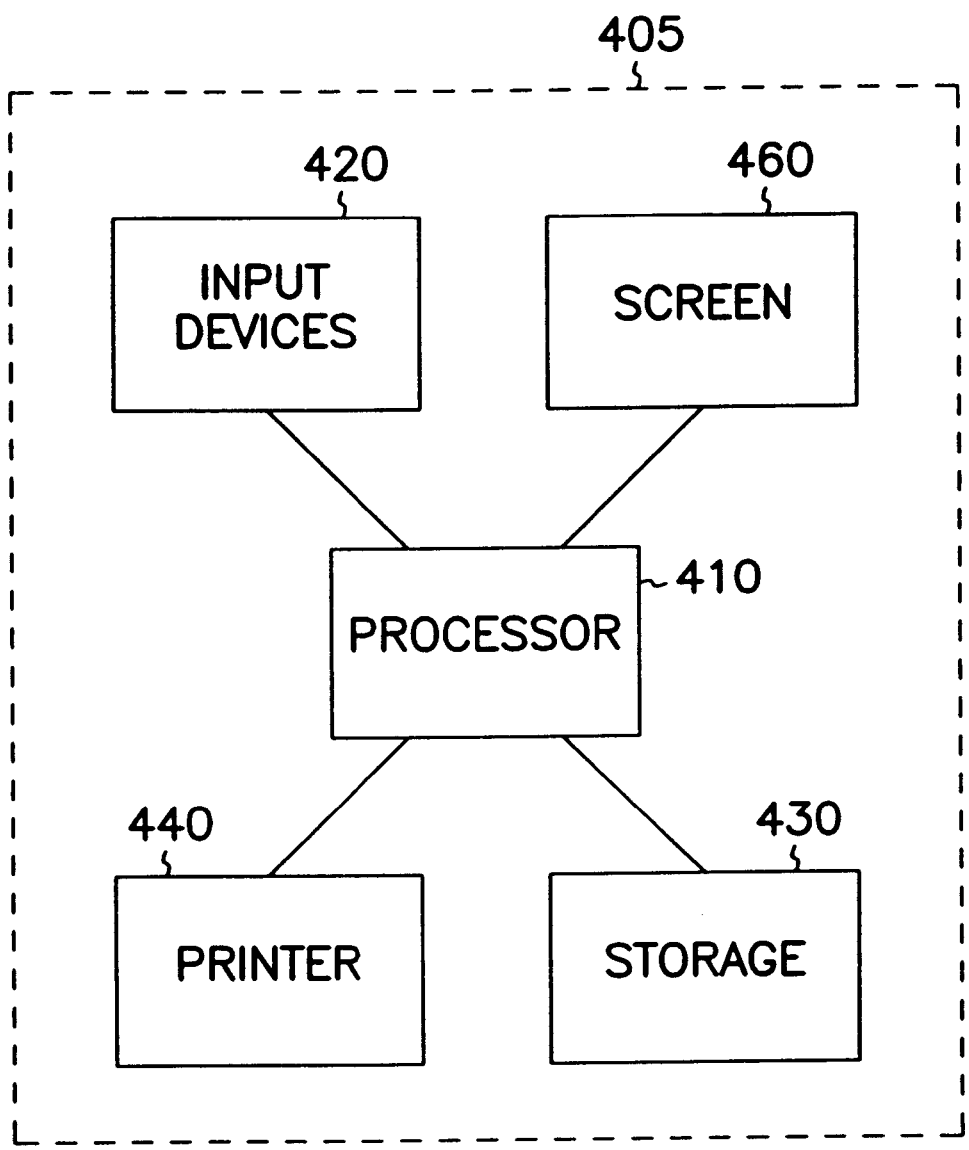
FIG. 4 is a block diagram of a computer system for creating schematic designs and for building flat netlists.

FIG. 4 is a block diagram of a computer system 405 in which the present invention is capable of being executed. A processor 410 is connected to input devices 420, such as a keyboard, mouse or digital drawing pad. Processor 410 is also connected to storage devices 430 (including RAM and disk drives), printer 440 and a screen 460.

Figure 5:
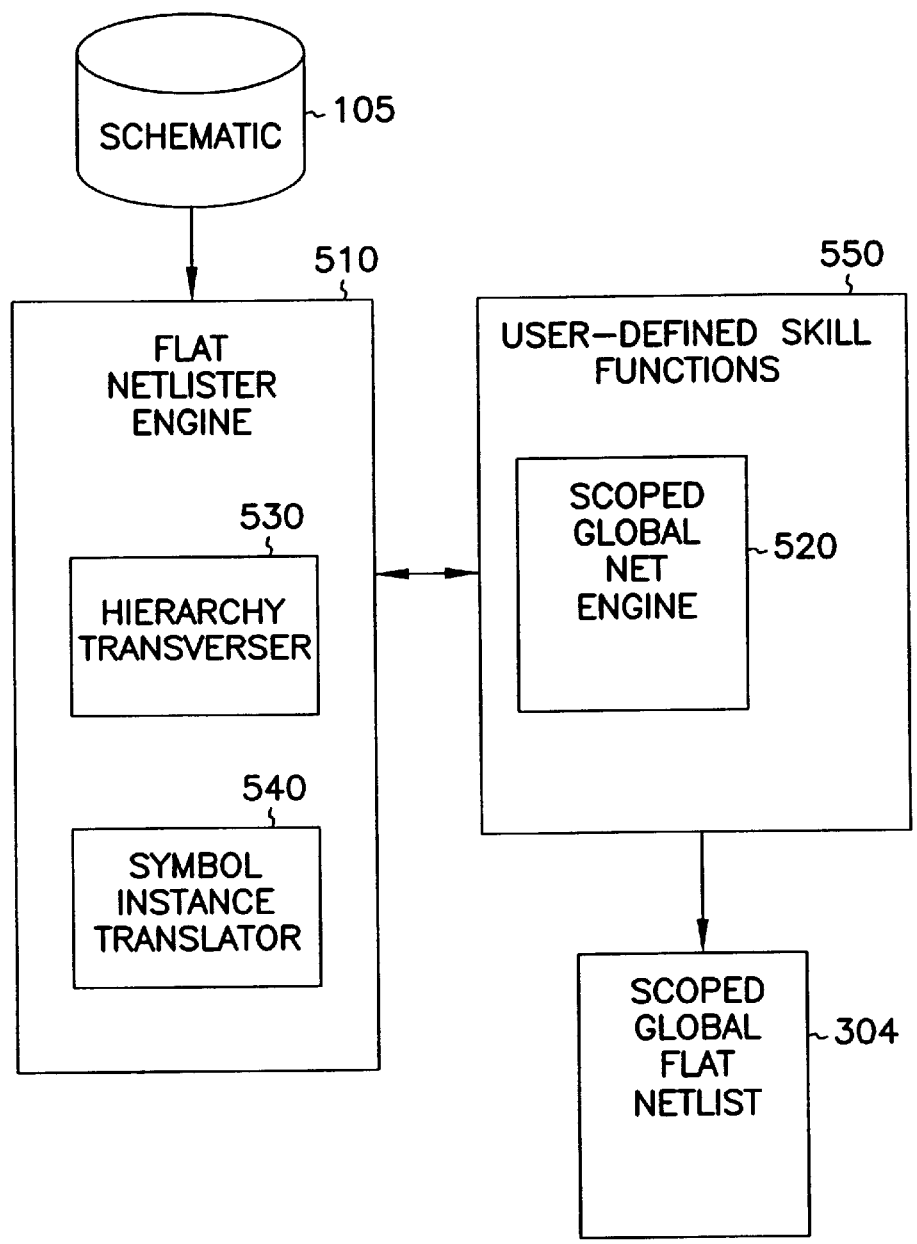
FIG. 5 is a block diagram showing the interaction between the flat netlister engine and the scoped global net engine.

FIG. 5 is a block diagram of a flat netlister engine 510 and the present invention, the scoped global net engine 520. Flat netlister engine 510 and scoped global net engine 520 are software programs residing in computer system 405. In one embodiment, scoped global net engine 520 is interfaced with flat netlister engine 510 so that flat netlister engine 510 passes the constructed scoped flat netlist file to scoped global net engine 520 before scoped global flat netlist 304 is written out to paper or disk. Flat netlister engine 510 consists of a hierarchy traverser 530, which walks through the designed schematic's hierarchy of symbol instances and nets. Flat netlister engine 510 also includes a symbol instance translator 540 which converts the pictorial symbol instances from schematic 105 into the appropriate text string of netlist. In one embodiment, flat netlister engine 510 and scoped global net engine 520 can be written in SKILL, a language provided by Cadence Design Systems, Inc., San Jose, Calif. In such an embodiment, scoped global net engine 520 can be implemented as user-provided Skill functions 550 msNet(), msFixNet() and msCreateMapList() interfaced to flat netlister engine 510. In other embodiments, other computer languages, such as C++, Pascal, and SmallTalk could be used as well.

Figure 6:
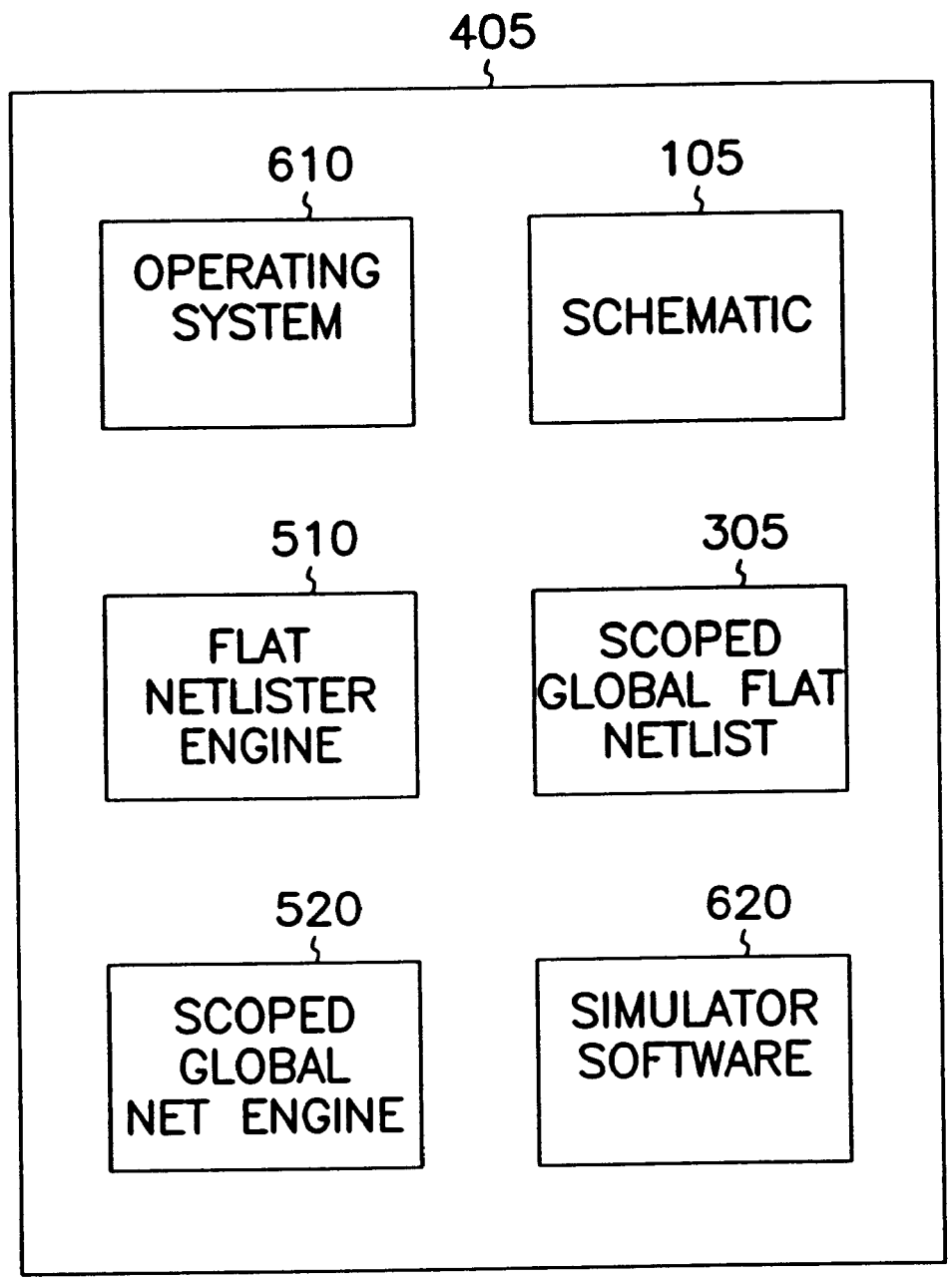
FIG. 6 is a block diagram of the computer system from FIG. 4 showing the programs and files in memory and storage which are used in the schematic design, the netlist creation and the simulation of the circuit.

FIG. 6 is another block diagram of computer system 405. Computer system 405 could be a workstation or other general purpose computer capable of producing scoped flat netlists 304 from schematics 105 in storage 430, such as RAM, a CD drive, a floppy disk drive, an optical disk, on hard drive.

Figure 7:
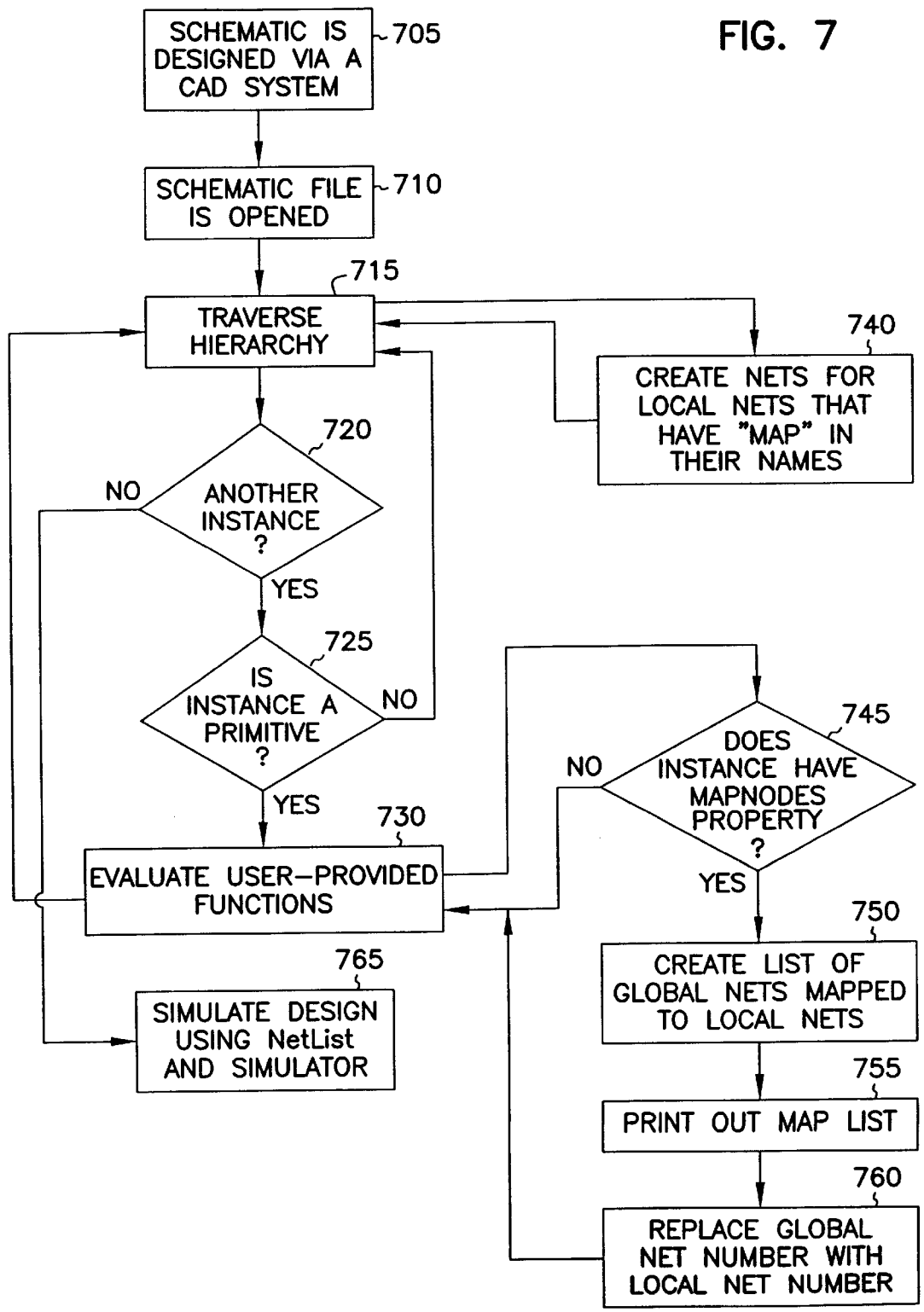
FIG. 7 is a flow chart showing the steps taken by the flat netlister engine and the scoped global net engine in the creation of the scoped flat netlist.

The process of circuit designing, netlisting and simulation is abbreviated in the flowchart of FIG. 7. In FIG. 7, schematic 105 is created by a CAD system at step 705. Steps 710 through 730 indicate the processing done by flat netlister engine 510. Steps 740 through 760 indicate the processing done by the present invention, scoped global net engine 520 to produce scoped global flat netlist. At step 710, flat netlister engine 510 opens file for schematic 105 and traverses schematic 105's hierarchy at step 715. During the hierarchical traversal, the net names are mapped for future reference. At step 740, the present invention tracks all global net numbers and assigns net numbers to local nets that contain "Map" in their names. Thus, the nets MapVccA and MapVccB from schematic 105 would be tracked. Comment lines are written to scoped global flat netlist and the net numbers are assigned. When a primitive instance is found at step 725, flat netlister engine 510 passes control to user-provided functions. As previously stated, the present invention may be implemented as user-provided Skill functions 550 msNet(), msFixNet() and msCreateMapList(). One embodiment of each of these three user-provided functions is shown by FIGS. 8A, 8B and 8C. In FIG. 8A, Skill code for msCreateMapList() is shown. In FIG. 8B, Skill code for msFixNet() is shown. And in FIG. 8C, Skill code for msNet() is shown. If an instance has the mapnodes property present at step 745, then a mapping list or other type of mapping association is created at step 750. This mapping list is printed at step 755 and contains an associated list of the global net numbers and their scoped local net numbers. Whenever a global net number is found in the netlist which is to be scoped to a local net, the present invention uses the mapping list to replace the global net number with the corresponding local net number at step 760. After all instances have been inspected and the scoped global nets replaced, control returns to flat netlister engine 510 at step 730. After the flat netlist has been created, at step 765 it can be used as input to a simulator. Such simulator could be HSPICE, which is available from Meta-Soft, Inc., Campbell, Calif.

Other embodiments of the present invention are possible without departing from the scope and spirit of the present invention. Other embodiments of this invention include a configuration allowing all nets to be scoped instead of only the global nets and the nets containing "Map" within their net names.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

We claim:

1. A method for scoping global nets during the conversion of a schematic file to a flat netlist, the method comprising:

constructing a text description for describing each placement of a plurality of instances of a schematic file and the connectivity of each of the plurality of instances to a plurality of global nets and to a plurality of local nets;

locating a scoped net instruction in the plurality of instances;

extracting a first scoped global net name and a first scoped local net name from the scoped net instruction;

determining a first global net identifier for the first scoped global net name;

determining a first local net identifier for the first scoped local net name; and substituting the first local net identifier for the first global net identifier in the text description.

2. The method for scoping global nets of claim 1, wherein locating a scoped net instruction in the plurality of the instances comprises locating a predefined scoped net instruction string within a parameter of the plurality of the instances.

3. The method for scoping global nets of claim 1, further comprising creating a mapping association for associating a plurality of global net identifiers with a plurality of local net identifiers.

4. A method for scoping global nets during the conversion of a schematic file to a flat netlist, the method comprising:

constructing a text description for describing each placement of a plurality of instances of a schematic file and the connectivity of each of the plurality of instances to a plurality of global nets and to a plurality of local nets wherein the plurality of instances of the schematic file comprises a plurality of primitives and a plurality of subcircuits;

locating a scoped net instruction in the plurality of instances wherein the scoped global instruction is to be enforced within the one of the plurality of instances and any subordinate subcircuits from the plurality of subcircuits;

extracting a first scoped global net name and a first scoped local net name from the scoped net instruction;

determining a first global net identifier for the first scoped global net name;

determining a first local net identifier for the first scoped local net name; and substituting the first local net identifier for the first global net identifier in the text description.

5. The method for scoping global nets of claim 4, wherein locating a scoped net instruction in the plurality of the instances comprises locating a predefined scoped net instruction string within a parameter of the plurality of the instances.

6. The method for scoping global nets of claim 4, further comprising creating a mapping association for associating a plurality of global net identifiers with a plurality of local net identifiers.

7. A method for scoping global nets, the method comprising:

entering a scoped global instruction for assigning a global net to a local net within one of a plurality of instances of a schematic file, wherein the scoped global instruction comprises a scoped global net name and a scoped local net name; and converting the schematic file to a flat netlist for inputting to a simulator or verifier, wherein the step of converting comprises:

constructing a text description for describing each placement of the plurality of instances, and the connectivity of each of the plurality of instances to the plurality of global nets and to the plurality of local nets;

locating a scoped net instruction in the plurality of instances;

extracting a first scoped global net name and a first scoped local net name from the scoped net instruction;

determining a first global net identifier for the first scoped global net name;

determining a first local net identifier for the first scoped local net name; and substituting the first local net identifier for the first global net identifier in the text description.

8. The method for scoping global nets of claim 7 wherein the plurality of instances of the schematic file comprises a plurality of primitives and a plurality of subcircuits; and wherein the scoped global instruction is to be enforced within the one of the plurality of instances and any subordinate subcircuits from the plurality of subcircuits.

9. The method for scoping global nets of claim 7, wherein locating a scoped net instruction in the plurality of the instances comprises locating a predefined scoped net instruction string within a parameter of the plurality of the instances.

10. The method for scoping global nets of claim 7, wherein converting the schematic file to a flat netlist further comprises creating a mapping association for associating a plurality of global net identifiers with a plurality of local net indentifiers.

11. A method of creating a mapping association for associating a global net with a local net, the method comprising:

receiving a parameter for an instance in a schematic;

checking the parameter for a scoped net instruction;

extracting a global net name from the scoped net instruction;

extracting a local net name from the scoped net instruction;

determining a global net identifier for the global net name;

determining a local net identifier for the local net name;

associating the global net identifier to the local net identifier; and storing the associated global net identifier and local net identifier to a mapping association.

12. A method for scoping global nets, the method comprising:

tracking a plurality of global nets and a plurality of local nets from a flat netlister program on a computer system, wherein the tracking comprises:

retrieving a first local net for scoping a first global net; and assigning a first local net identifier;

creating a mapping association for associating the plurality of global nets with the plurality of local nets, wherein the creating a mapping association comprises:
receiving a parameter for an instance in a schematic;
checking the parameter for a scoped net instruction;
extracting a second global net name from the scoped net instruction;
extracting a second local net name from the scoped net instruction;
determining a second global net identifier for the second global net name;
determining a second local net identifier for the second local net name;
associating the second global net identifier to the second local net identifier; and
storing the associated second global net identifier and second local net identifier to a mapping association; and
transforming a global net to a local net during a netlisting process.

13. The method for scoping global nets of claim 12 wherein transforming a global net comprises:
retrieving a third global net identifier;
locating the third global net identifier in the mapping association;
locating a third local net identifier associated with the third global net identifier in the mapping association; and
replacing the third global net identifier with the third local net identifier.

14. A computer-readable medium having computer executable components comprising:
a net tracker component to retrieve a local net from a plurality of nets and to assign a local net identifier for the local net;
a map association creator component for associating a global net with the local net, wherein the map association creator component further comprises:
an instruction checker component for inspecting a parameter of an instance of a schematic for a scoped net instruction;
an extractor component for extracting a second global net name and a second local net name from the scoped net instruction;
a number resolver component for determining a second global net identifier for the second global net name and a second local net identifier for the second local net name; and
a number associator component for storing an association of the second global net identifier to the second local net identifier in a mapping association; and
a net scoper component for transforming the global net to be locally scoped within a flat netlist.

15. The computer-readable medium of claim 14 wherein net scoper component further comprises:
a net receiver component for accepting a third global net identifier;
a map locator component for locating the third global net identifier in the mapping association;
an association locator component for locating a third local net identifier associated to the third global net identifier in the mapping association; and a net replacer component for replacing the third global net identifier with the third local net identifier.

16. A computer-readable medium having stored thereon computer-executable instructions performing a method of causing global nets in a schematic to be scoped to a local region in a flat netlist, the method comprising:
tracking a plurality of nets, wherein the plurality of nets comprise a plurality a global nets and a plurality of local nets, wherein the plurality of global nets comprise a plurality of global net names and a plurality of global net identifiers, wherein the plurality of local nets comprise a plurality of local net names and a plurality of local net identifiers;
creating a mapping association for associating a plurality of global nets with a plurality of local nets, wherein creating a mapping association comprises:
receiving a parameter for an instance in a schematic;
checking the parameter for a scoped net instruction;
extracting a second global net name from the scoped net instruction;
extracting a second local net name from the scoped net instruction;
determining a second global net identifier for the second net name;
determining a second local net identifier for the second local net name;
associating the second global net identifier to the second local net identifier; and
storing the associated second global net identifier and second local net identifier to a mapping association; and
transforming a net to be locally scoped.

17. The computer-readable medium of claim 16 having further computer executable instructions for transforming a net, comprising:
retrieving a third global net identifier;
locating the third global net identifier in the mapping association;
locating a third local net identifier associated with the third global net identifier in the mapping association; and
replacing the third global net identifier with the third local net identifier.

18. A computer-readable medium having stored thereon computer-executable instructions for performing a method of scoping global nets during the conversion of a schematic file to a flat netlist, the method comprising:
constructing a text description for describing each placement of a plurality of instances of a schematic file and the connectivity of each of the plurality of instances to a plurality of global nets and to a plurality of local nets;
locating a scoped net instruction in the plurality of instances;
extracting a first scoped global net name and a first scoped local net name from the scoped net instruction;
determining a first global net identifier for the first scoped global net name;
determining a first local net identifier for the first scoped local net name; and
substituting the first local net identifier for the first global net identifier in the text description.

* * * * *